(12) United States Patent
Antesberger et al.

(10) Patent No.: US 12,122,066 B2
(45) Date of Patent: Oct. 22, 2024

(54) EXTRUSION DIES AND METHODS OF MANUFACTURING THE SAME

(71) Applicant: CORNING INCORPORATED, Corning, NY (US)

(72) Inventors: Timothy Eugene Antesberger, Vestal, NY (US); Dana Eugene Coots, Tioga, PA (US); Eric Jay Dacheux, Lawrenceville, PA (US); Kevin Eugene Elliott, Horseheads, NY (US); Gary Michael Huzinec, Horseheads, NY (US); Neil James Sidebottom, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 464 days.

(21) Appl. No.: 17/429,481

(22) PCT Filed: Jan. 30, 2020

(86) PCT No.: PCT/US2020/015847
§ 371 (c)(1),
(2) Date: Aug. 9, 2021

(87) PCT Pub. No.: WO2020/167487
PCT Pub. Date: Aug. 20, 2020

(65) Prior Publication Data
US 2022/0105658 A1    Apr. 7, 2022

Related U.S. Application Data

(60) Provisional application No. 62/806,010, filed on Feb. 15, 2019.

(51) Int. Cl.
*B28B 3/26*    (2006.01)
*B23P 15/24*   (2006.01)
(Continued)

(52) U.S. Cl.
CPC ............ *B28B 3/269* (2013.01); *B23P 15/243* (2013.01); *C23C 16/36* (2013.01); *C23C 16/56* (2013.01); *B28B 2003/203* (2013.01)

(58) Field of Classification Search
CPC ... B28B 3/269; B28B 2003/203; B29C 48/11; B29C 48/3001; B29C 48/3003; B29C 48/345; B23P 15/243
See application file for complete search history.

(56) References Cited

U.S. PATENT DOCUMENTS 3,790,654 A    2/1974  Bagley
4,235,583 A   11/1980  Reed
(Continued)

FOREIGN PATENT DOCUMENTS

CN    104781056 A    7/2015
CN    107848900 A    3/2018
(Continued)

OTHER PUBLICATIONS

International Search Report and Written Opinion of the International Searching Authority; PCT/US2020/015847; dated May 12, 2020; 14 pages; European Patent Office.

*Primary Examiner* — Nahida Sultana
*Assistant Examiner* — Mohamed K Ahmed Ali
(74) *Attorney, Agent, or Firm* — Kevin M. Able (57) ABSTRACT

Methods of manufacturing an extrusion die (100) having a plurality of pins (600*a-c*) and a plurality of slots (601) defined by the plurality of pins, each pin having a base, the method including applying a coating material (604) over side walls of the bases of the pins of the extrusion die and removing a portion of the coating material coated over the side walls of the bases of the plurality of pins with a cutting tool (650). In some embodiments, the cutting tool has a cutting width (652) equal to a target slot width (640) of the slots. In some embodiments, applying the coating material (Continued)

over the side walls of the bases of the pins includes overcoating a coating material to a thickness that is greater than a thickness needed to define a target slot width of the slots.

5 Claims, 8 Drawing Sheets

(51) Int. Cl.
*B28B 3/20* (2006.01)
*C23C 16/36* (2006.01)
*C23C 16/56* (2006.01)

(56) References Cited

U.S. PATENT DOCUMENTS

| | | | |
|---|---|---|---|
| 4,722,819 | A | 2/1988 | Lundsager |
| 4,884,960 | A | 12/1989 | Chao |
| 6,290,837 | B1 | 9/2001 | Iwata et al. |
| 2008/0124423 | A1 | 5/2008 | Peterson et al. |
| 2010/0244309 | A1 | 9/2010 | Hayashi et al. |
| 2011/0052745 | A1* | 3/2011 | Corbett .................. B29C 48/11 |
| | | | 425/464 |
| 2014/0060253 | A1 | 3/2014 | Brew et al. |
| 2016/0136633 | A1* | 5/2016 | Watanabe ............... B28B 3/269 |
| | | | 428/116 |

FOREIGN PATENT DOCUMENTS

| | | |
|---|---|---|
| EP | 3023211 A1 | 5/2016 |
| JP | 2009-196251 A | 9/2009 |
| WO | 2006/062851 A1 | 6/2006 |
| WO | 2017/015489 A1 | 1/2017 |
| WO | 2018/123653 A1 | 7/2018 |

\* cited by examiner

FIG. 8A

EXTRUSION DIES AND METHODS OF MANUFACTURING THE SAME

This is a national stage application under 35 U.S.C. § 371 of International Application No. PCT/US2020/015847, filed on Jan. 30, 2020, which claims the benefit of priority under 35 U.S.C. § 119 of U.S. Provisional Application No. 62/806,010 filed on Feb. 15, 2019, the content of which is incorporated herein by reference in its entirety.

FIELD

The present disclosure relates to extrusion dies. In particular, the present disclosure relates to honeycomb extrusion dies and methods of manufacturing the same by coating pins of the dies with a coating material, and then removing a portion of the coating material with a cutting tool.

BACKGROUND

Extrusion dies are useful in forming cellular or honeycomb ceramic substrates for a variety of purposes, such as catalytic converters and particulate filters, which are utilized in exhaust systems of internal combustion engines. Formation of some ceramic honeycomb bodies involves extruding a ceramic-forming mixture through a honeycomb extrusion die and then subjecting the green extrudate to subsequent manufacturing steps, such as drying, cutting, and firing to form the ceramic honeycomb bodies. The surfaces of the extrusion dies may be coated with inorganic particles to improve wear resistance and extend the life of the die. There is a continued need for methods and systems for manufacturing extrusion dies, and in particular, extrusion dies having coated surfaces.

BRIEF SUMMARY

The present disclosure is directed to methods of manufacturing extrusion dies, for example honeycomb extrusion dies that can be used to manufacture, for example, catalytic converters and particulate filters in automobiles. The extrusion dies can comprise a plurality of pins defining a plurality of slots through which batch extrusion material can be flowed. Methods disclosed herein are designed to achieve a desired target slot by machining with a cutting tool, such as an abrasive slitting wheel. In some embodiments, the slots are defined by coating the pins with a coating material, then removing a portion of the coating material with a cutting tool having a cutting width equal to a target slot width of the slots. In some embodiments, the pins are overcoated with coating material having a thickness greater than the thickness needed to achieve a desired target slot width prior to removing a portion of the coating material. In some embodiments, each pin has a pre-existing coating material disposed on a sidewall of the pin. In some embodiments, a layer of coating material is disposed directly on a sidewall of each of the pins. In some embodiments, a layer of coating material is disposed on the pre-existing coating material disposed on the sidewalls of each of the pins.

In some embodiments, the pins are arranged in rows such that the cutting tool can remove a portion of overcoated coating material from two adjacent rows of pins in a single pass thereby sequentially defining the target slot width for each slot defined by the rows of pins in a single machining operation.

Some embodiments are directed to a method of manufacturing an extrusion die having a plurality of pins and a plurality of slots defined by the plurality of pins, each pin having a base, the method comprising applying a coating material over side walls of the bases of the pins of the extrusion die and removing a portion of the coating material coated over the side walls of the bases of the plurality of pins with a cutting tool, the cutting tool having a cutting width equal to a target slot width of the slots.

In some embodiments, the method according to embodiments of the preceding paragraph comprises applying the coating material over the bases of pins of the extrusion die by overcoating the side walls of the bases such that the coating material defines a reduced slot width less than the target slot width.

In some embodiments, the method according to embodiments of any of the preceding paragraphs comprises defining the slots by removal of the portion of the coating material in a single pass of the cutting tool for each slot.

In some embodiments, the method according to embodiments of any of the preceding paragraphs comprises defining the slots by removal of the portion of the coating material in two or more passes of the cutting tool for each slot.

In some embodiments, the target slot width of the slots according to embodiments of any of the preceding paragraphs is in the range of about 0.001 inches to about 0.025 inches. In some embodiments, the target slot width of the slots according to embodiments of any of the preceding paragraphs is in the range of about 0.003 inches to about 0.016 inches.

In some embodiments, the cutting tool according to embodiments of any of the preceding paragraphs removes at least 0.0005 inches of a thickness of the coating material coated over one of the side walls of one of the bases.

In some embodiments, the coating material according to embodiments of any of the preceding paragraphs has an average coating thickness in the range of 0.0006 inches to 0.006 inches after the portion of the coating material coated on the side walls of the bases is removed with the cutting tool.

In some embodiments, the cutting tool according to embodiments of any of the preceding paragraphs comprises abrasive particles selected from the group consisting of: diamond particles, cubic boron nitride particles, silicon carbide particles, aluminum oxide particles, boron carbide particles, or a combination thereof.

In some embodiments, the coating material of two adjacent pins of the plurality of pins according to embodiments of any of the preceding paragraphs defines a reduced slot width, where the reduced slot width is 0% to 95% of the target slot width.

In some embodiments, the cutting tool according to embodiments of any of the preceding paragraphs is an abrasive slitting wheel.

In some embodiments, the slots of the extrusion die according to embodiments of any of preceding paragraphs define a honeycomb geometry.

In some embodiments, the method according to embodiments of any of the preceding paragraphs comprises applying the coating material with a vapor deposition process.

In some embodiments, the coating material according to embodiments of any of the preceding paragraphs comprises at least one of: boron-doped titanium carbonitride or titanium carbonitride.

In some embodiments, applying the coating material according to embodiments of any of the preceding paragraphs comprises applying the coating material directly to the bases of the pins.

In some embodiments, the pins according to embodiments of any of the preceding paragraphs comprises a pre-existing coating material coated over the side walls of the bases, where applying the coating material includes applying the coating material on the pre-existing coating material.

In some embodiments, the coating material according to embodiments of any of the preceding paragraphs defines exterior most side walls of the plurality of pins.

Some embodiments are directed to a method of manufacturing an extrusion die, the method comprising: overcoating an extrusion die with a coating material, where the extrusion die comprises a first pin having a first base having a first side wall and a second pin having a second base having a second side wall, the first pin and the second pin defining a slot therebetween, where overcoating the extrusion die comprises forming a first coating layer over the first side wall of the first pin and a second coating layer over the second side wall of the second pin, where the first and second coating layers define a reduced slot width between the first pin and the second pin, and where the reduced slot width is 0% to 99% of a target slot width measured between a first exterior surface of the first coating layer and a second exterior surface of the second coating layer; and removing an overcoated portion of the first coating layer and an overcoated portion of the second coating layer from within the slot such that a cut slot width of the slot is the target slot width.

In some embodiments, the overcoated portion of the first coating layer according to embodiments of the preceding paragraph occupies a coated area over the first base equal to at least 20% of an area of the first side wall.

In some embodiments, the overcoated portion of the second coating layer according to embodiments of any of the two preceding paragraphs occupies a coated area over the second base equal to at least 20% of an area of the second side wall.

In some embodiments, the cutting tool according to embodiments of any of the three preceding paragraphs has a cutting width equal to the target slot width.

In some embodiments, the overcoated portion of the first coating layer and the overcoated portion of the second coating layer according to embodiments of any of the four preceding paragraphs are removed with a single pass of the cutting tool. In some embodiments, the overcoated portion of the first coating layer and the overcoated portion of the second coating layer according to embodiments of any of the four preceding paragraphs are removed with two or more passes of the cutting tool.

In some embodiments, the target slot width according to embodiments of any of the five preceding paragraphs is in the range of about 0.001 inches to about 0.025 inches. In some embodiments, the target slot width according to embodiments of any of the five preceding paragraphs is in the range of about 0.003 inches to about 0.016 inches.

In some embodiments, the reduced slot width according to embodiments of any of the six preceding paragraphs is 50% to 99% of the target slot width. In some embodiments, the reduced slot width according to embodiments of any of the six preceding paragraphs is 80% to 95% of the target slot width.

In some embodiments, the reduced slot width according to embodiments of any of the seven preceding paragraphs is at least 0.001 inches less than the target slot width.

In some embodiments, the cutting tool according to embodiments of any of the eight preceding paragraphs is an abrasive slitting wheel.

In some embodiments, the method according to embodiments of any of the nine preceding paragraphs comprises overcoating the extrusion die with a coating material using a vapor deposition process.

In some embodiments, the extrusion die according to embodiments of any of the ten preceding paragraphs is a honeycomb extrusion die.

Some embodiments are directed to a method of manufacturing an extrusion die, the method comprises overcoating an extrusion die with a coating material, where the extrusion die comprises a first pin comprising a first base having a first side wall and a second pin comprising a second base having a second side wall, the first pin and the second pin defining a slot therebetween, where overcoating the extrusion die comprises forming a first coating layer over the first side wall of the first pin and a second coating layer over the second side wall of the second pin, and where the first and second coating layers completely fill the slot with the coating material, thereby creating a completely filled slot; and removing a portion of the coating material from the completely filled slot such that a cut slot width of the slot is equal to a target slot width measured between a first exterior surface of the first coating layer and a second exterior surface of the second coating layer.

Some embodiments are directed to an extrusion die comprising a plurality of pins defining a plurality of slots arranged in a honeycomb geometry, the plurality of pins having a first pin and a second pin adjacent to the first pin, where at least one of the first pin or the second pin comprises a base having a non-parallel side wall with respect to a longitudinal axis of the extrusion die; a first coating layer disposed over a side wall of the first or second pin and comprising a first exterior surface parallel to the longitudinal axis; and a second coating layer disposed over the non-parallel side wall of the first or second pin and comprising a second exterior surface parallel to the longitudinal axis, and an interior surface opposite the second exterior surface that is not parallel to the longitudinal axis.

In some embodiments, the first and second exterior surfaces according to embodiments of the preceding paragraph are machined surfaces.

In some embodiments, the first pin and the second pin according to embodiments of any of the two preceding paragraphs each comprise a non-parallel side wall with respect to the longitudinal axis of the extrusion die.

Some embodiments are directed to a method of manufacturing an extrusion die having a first row of pins each comprising a base having a first side wall, and a second row of pins adjacent to the first row of pins and each having a base having a second side wall, where each pin of the first row and each pin of the second row define a slot therebetween, the method comprising: overcoating the extrusion die with a coating material by forming a first coating layer over the first side walls of the first pins and a second coating layer over the second side walls of the second pins, where the first and second coating layers define a reduced slot width between the first row of pins and the second row of pins, and where the reduced slot width is 10% to 95% of a target slot width; and removing an overcoated portion of the first coating layer and an overcoated portion of the second coating layer from within the slots between the first and second rows of pins such that an exterior surface of the first coating layer and an exterior surface of the second coating layer define the target slot width.

In some embodiments, the overcoated portion of the first coating layer and the overcoated portion of the second coating layer according to the embodiments of the preceding paragraph are removed from the first row of pins and the second row of pins with a single pass of the cutting tool between the first row of pins and the second row of pins.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Ceramics having honeycomb geometries, such as those used in catalytic converters and particulate filters in automobiles, are often manufactured using extrusion processes. Dies used in these processes are typically made using stainless steel or other metals and have honeycomb geometries made up of several pins defining several slots through which a ceramic-forming mixture (or batch material) can be flowed to create a green honeycomb extrudate that can be further processed, e.g., dried, cut, fired, etc. to form a final ceramic honeycomb product.

The ceramic-forming mixture that is flowed through the extrusion die can be abrasive (i.e., contains one or more types of particles that will abrade the surfaces of an extrusion die during extrusion). For example, a ceramic-forming mixture can include components such as silica, alumina, etc., which can have an abrasive effect on the surfaces of an extrusion die. Because the ceramic-forming mixtures that are used to create the honeycomb-shaped extruded parts are abrasive, the ceramic-forming mixtures can cause the surfaces of the pins within the extrusion dies to become worn, which can result in undesirable, non-uniform geometries and/or variable dimensions in the extruded parts. And, if the dies become too worn, they can no longer be usable to produce honeycomb structures that are within specified dimensional tolerances.

To increase the wear resistance of a die, thereby increasing the number of times that it can be used (e.g., the volume and/or number of linear feet of ceramic-forming mixture that can be extruded through the die), a coating can be applied over surfaces of the die. Typical coating materials include titanium carbonitride (TiCN), boron doped titanium carbonitride (B-TiCN), titanium nitride (TiN), and titanium aluminum nitride (TiAlN), but other coatings can be used, as well.

One or more coatings can be applied over surfaces of the extrusion die using any applicable process, such as a vapor deposition process. If a vapor deposition process is used, the thickness of the coating material applied over surfaces of the die can be controlled by, for example, an impedance disk disposed within the deposition chamber. In this way, the coating process(es) can be used to set the final dimensions of the features of an extrusion die (e.g., the slot widths). However, even if the coating process and/or the dimensions of the coating material are carefully controlled, defects such as nodules, non-uniform surface finishes, and variability in the final finished slot widths (both within a single die and between multiple dies) can result during the coating process. Accordingly, additional post-coating manufacturing processes may be required to address any defects and achieve desired dimensions.

Nodules, as referred to herein, generally relate to protrusions on a coated surface which may cause partial or full blockages of an extrusion die's slots. Some nodules are formed as a result of a particle (e.g., dust or dirt) on the surface of the extrusion die that becomes coated, thereby creating a protrusion in the coating over the particle. Variability in the dimensions of a coated extrusion die may also result from other sources, such as dimensional changes of the underlying features of an extrusion die following in a vapor deposition process (e.g., warping or bending that results from high temperature induced stresses), vibrations in a cutting tool during machining, etc. Blockages and variable dimensions of the slots can result in defects that undesirably affect the performance or properties of the final honeycomb part, such as weakening the strength of the final product and/or the creation of tears, holes, etc. in the extruded honeycomb structure. These defects can be caused by variables of a vapor deposition process or other manufacturing processes that are difficult to control. Accordingly, post-processing of the coated surfaces of dies may be desired to remove defects such as nodules and/or to otherwise correct for undesirable variability in the dimensions of the extrusion die.

Typically, defects such as nodules are removed from the coated surfaces using a process that may be referred to as shimming. During shimming or similar processes, the nodules are individually removed from the coated surfaces using a small file (or "shim"). Because there can be hundreds of slots within a single die, which slots can have widths on the order of only a few thousandths of an inch, the die inspection and shimming process can be extremely tedious, expensive, and time consuming. Accordingly, a more efficient process for creating dimensionally accurate honeycomb extrusion die geometries is desirable.

Figure 1:
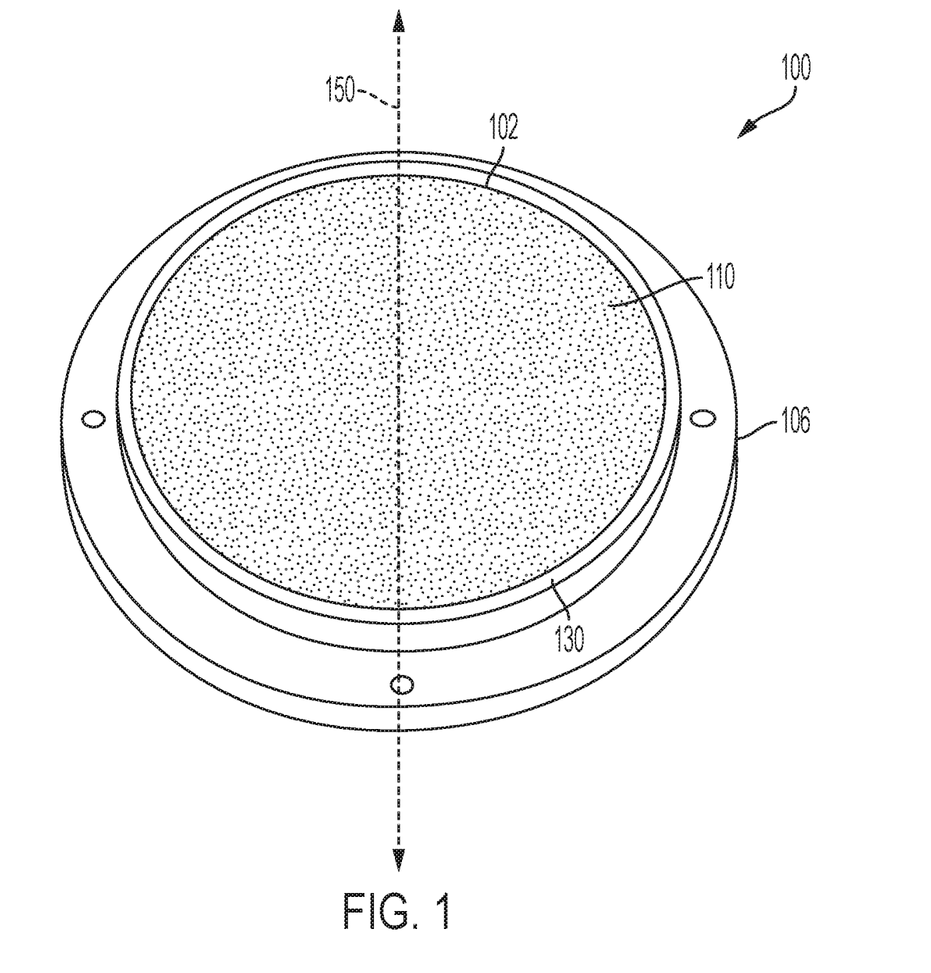
FIG. 1 illustrates an extrusion die according to some embodiments.
Figure 2:
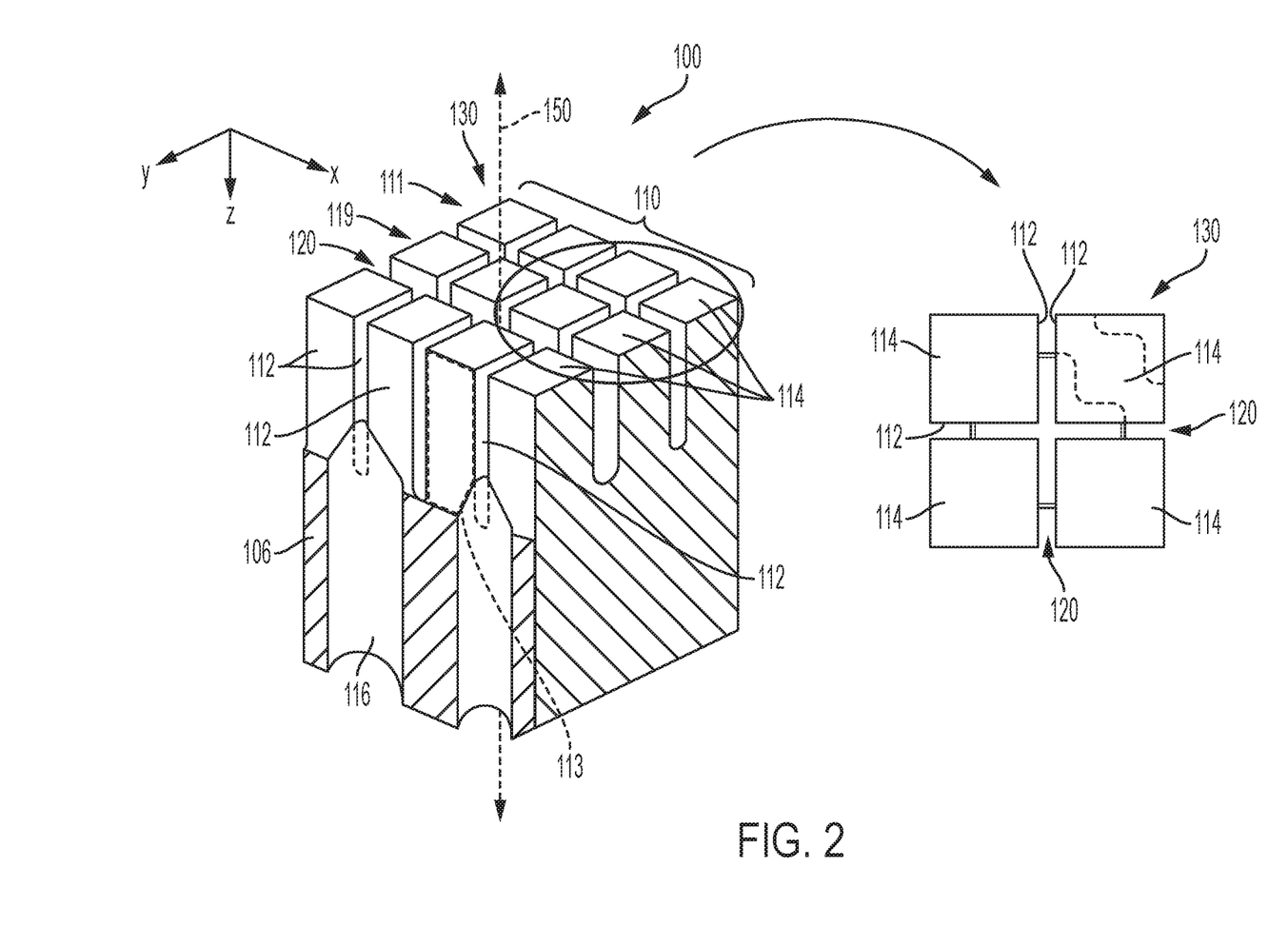
FIG. 2 illustrates a partial perspective end view of the extrusion die of FIG. 1 and an enlarged view of a discharge face of a plurality of pins of the extrusion die of FIG. 1.

FIGS. 1 and 2 illustrate an extrusion die 100 and a honeycomb-forming structure 102 of extrusion die 100 according to some embodiments. In some embodiments, extrusion die 100 comprises a die body 106, comprising a plate, a flange or other structure configured to enable the extrusion die to be secured to other components at the end of an extrusion line. The die body 106 can comprise a plurality of feedholes formed therein (some shown partially in FIG. 2) at an inlet or upstream face of the extrusion die (not shown). The extrusion die 100 also comprises an array of pins 110 at a discharge face 130 that is oriented in a downstream direction. Side walls 112 of pins 110 define a crisscrossing array of discharge slots 120. The crisscrossing array of discharge slots 120 defines the shape of the extrudate made by the die 100, e.g., extrudate having a honeycomb geometry. In this way, the array of pins 110 and slots 120 together define the honeycomb-forming structure 102 for the extrusion die 100. The discharge face 130 of extrusion die 100 is formed by end surfaces 114 of pins 110.

In some embodiments, the pins 110 are formed integrally from the same piece of material as the body 106, while in other embodiments the pins 110 are bonded to the body 106, e.g., via a pin support layer. Die body 106 comprises feedholes 116 for conveying the ceramic-forming mixture through die body 106. The feedholes 116 intersect the pins 110 and slots 120 at the root ends of pins 110.

Any known or discovered materials can be used to construct extrusion die 100. Examples of materials suitable for the fabrication of the major die elements include tool steels, so-called high-speed steels, martensitic steels, precipitation hardening steels, and stainless steels, such as martensitic stainless steels. Exemplary martensitic stainless steels include, but are not limited to, 400 series stainless steels, such as 422 stainless steels and 450 stainless steels, and precipitation hardening stainless steels, such as 17-4 PH stainless steels.

Figure 3:
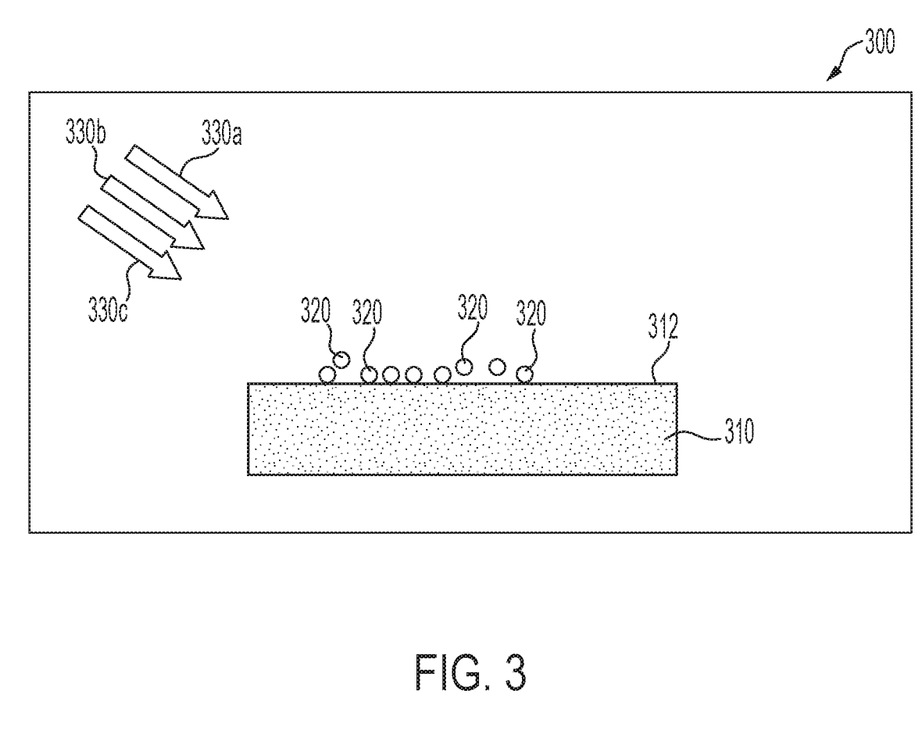
FIG. 3 illustrates a deposition process according to some embodiments.

FIG. 3 illustrates a deposition process for applying inorganic particles 320 over a surface 312 of a substrate 310 within a deposition chamber 300. The process illustrated in FIG. 3 can be a vapor deposition process, such as a chemical vapor deposition (CVD) process or a physical vapor deposition (PVD) process. One or more gases 330 (e.g., gas 330a, gas 330b, and gas 330c) are introduced into chamber 300 to form inorganic particles within chamber 300, which deposit on or over surface 312. In some embodiments, a single gas is used, while in other embodiments, multiple gases are used, depending on the particle(s) that are being deposited. One or more gases 330 can be source gases for one or more elements of an inorganic particle. One or more gases 330 can be carrier gases. Any suitable type of source gas or carrier gas can be introduced into chamber at appropriate flow rates to form and apply inorganic particles 320 over surface 312 of substrate 310. In some embodiments, inorganic particles 320 are disposed on surface 312. Surface 312 can be formed of a metallic material, such as any steel material discussed herein.

As used herein, "disposed on" means that a first layer/component is in direct contact with a second layer/component. A first layer/component "disposed on" a second layer/component may be deposited, formed, placed, or otherwise applied directly onto the second layer/component. In other words, if a first layer/component is disposed on a second layer/component, there are no layers disposed between the first layer/component and the second layer/component. Similarly, "applied on" or "coated on" means that a first layer/component is in direct contact with a second layer/component. If a first layer/component is described as "disposed over" a second layer/component, other layers may optionally be present between the first layer/component and the second layer/component. Similarly, "applied over" or "coated over" means other layers may or may not be present between the first layer/component and the second layer/component. The layers and/or coatings described herein can be any thickness or thicknesses, as well as continuously or intermittently applied over a surface.

In some embodiments, substrate 310 is an extruder component. In some embodiments the extruder component is an extrusion die (e.g., extrusion die 100) or a component of an extrusion die (e.g., pins 110). In some embodiments, substrate 310 is formed by extrusion die 100, or portion of extrusion die 100, having a plurality of pins 110 and side walls 112 of one or more of the plurality of pins 110 defines the surface 312 of substrate 310 over which inorganic particles are applied during a deposition process. Substrate 310 can be, for example, a base 402 of extrusion die pins 400 (e.g., pins 400a, 400b, and 400c shown in FIG. 4, all of which may be collectively referred to by the reference numeral 400). As discussed below, the bases 402 can be directly coated by the particles 320 or can be coated with a pre-existing coating material 420 over which a second layer of inorganic particles, for example coating layer 422, are applied during a deposition process. Alternatively stated, a coating layer 407 on the base 402 can be a multi-layer coating that comprises coating layers 420 and 422.

Inorganic particles 320 can be any type of inorganic particle discussed herein. The deposition process illustrated in FIG. 3 can be used to deposit any number of the inorganic particle layers or abrasion-resistant coating layers discussed herein. For example, the deposition process illustrated in FIG. 3 can be used to apply titanium carbonitride and/or boron-doped titanium carbonitride particles, boron particles, aluminum titanium nitride particles, titanium aluminum nitride particles, and chromium nitride particles. In some embodiments, a combination of any of the inorganic particles discussed herein are applied over surface 312 of substrate 310. Deposition of any of the inorganic particles discussed herein can form one or more layers of inorganic material over surface 312 of substrate 310 (e.g., coating layers described herein). The inorganic particles applied according to embodiments discussed herein can form an abrasion-resistant coating on surface 312 of substrate 310.

Figure 4:
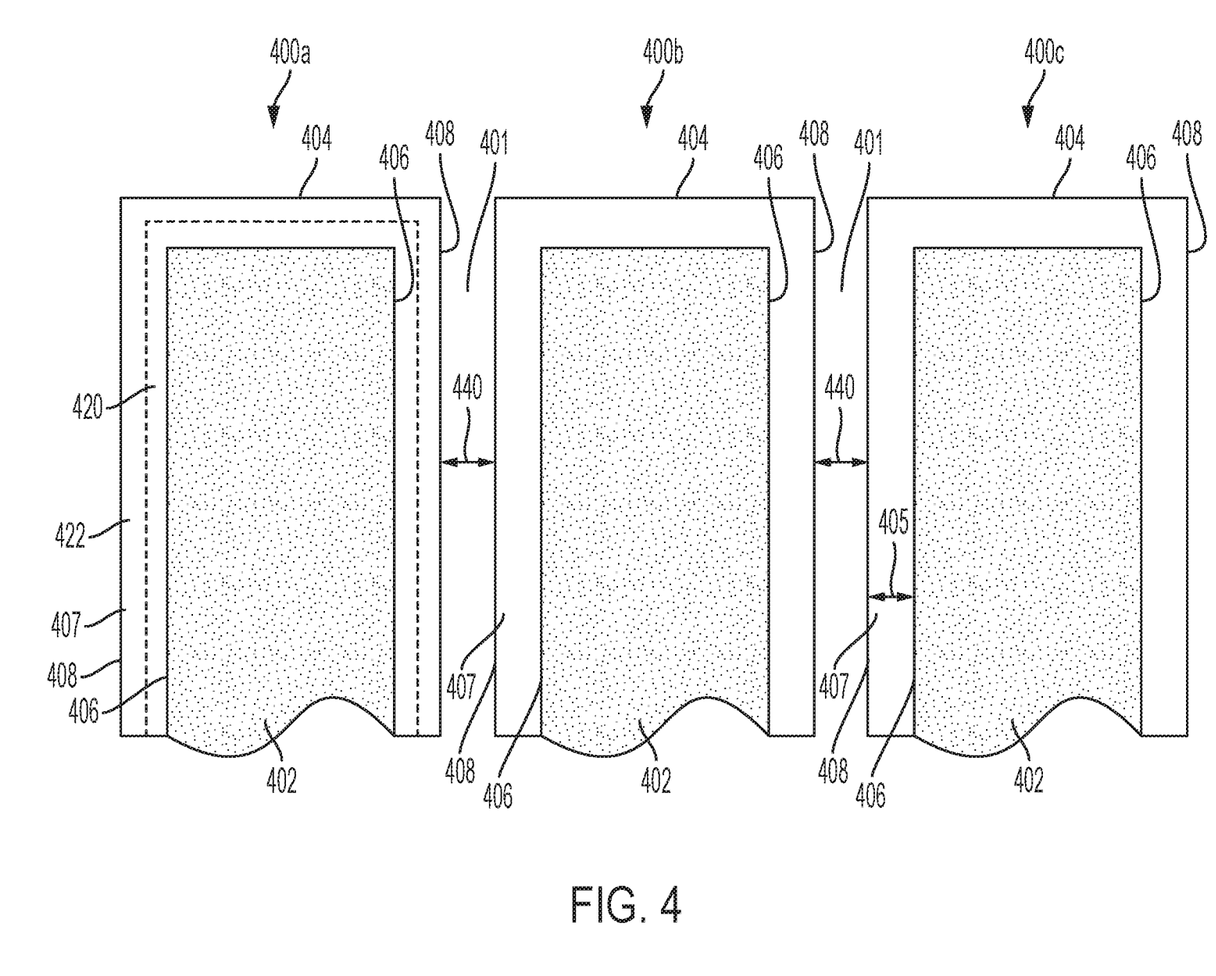
FIG. 4 illustrates pins of an extrusion die according to some embodiments.
Figure 5:
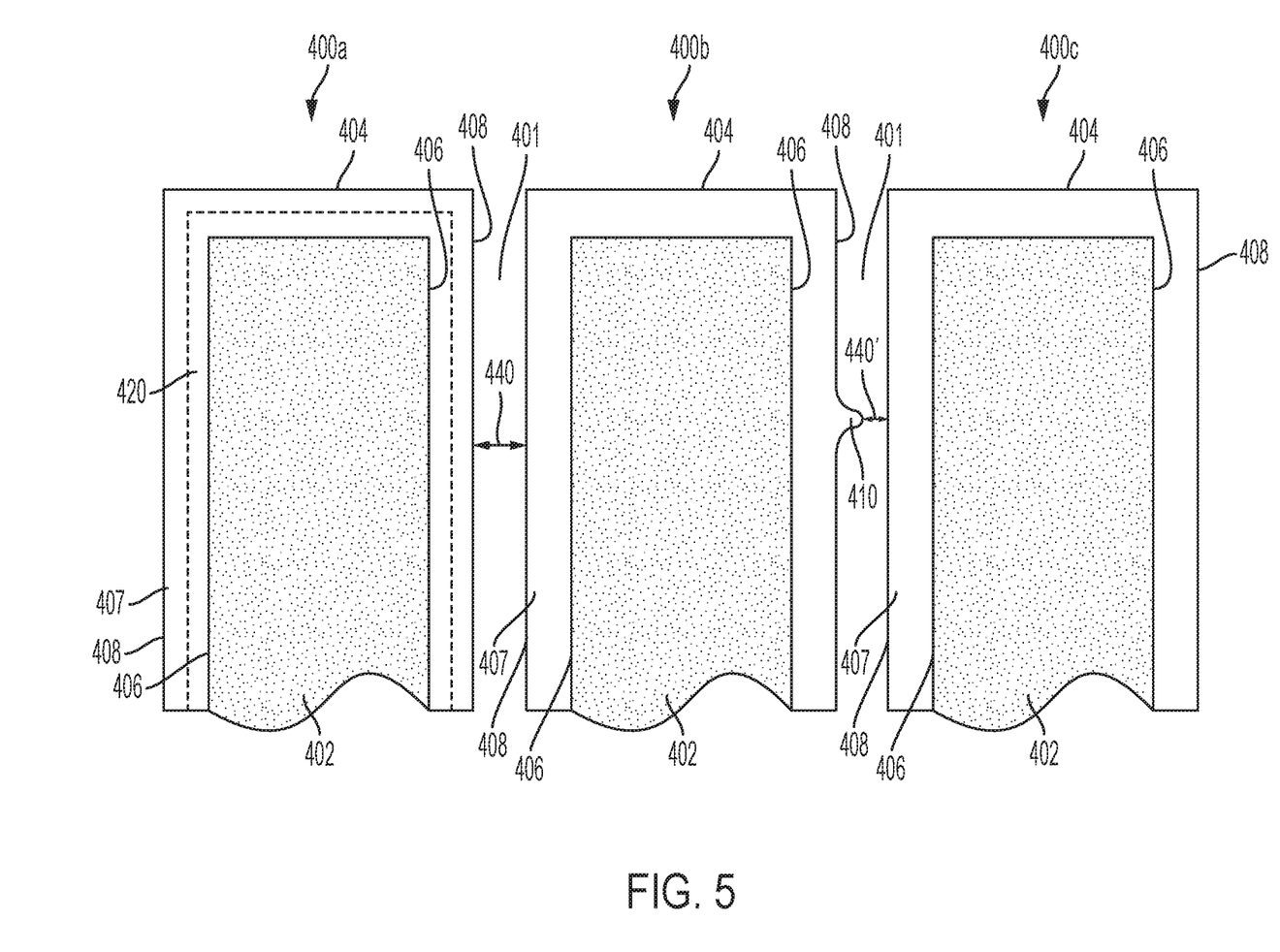
FIG. 5 illustrates pins of an extrusion die having a coating imperfection.

FIGS. 4 and 5 illustrate pins 400a-c of an extrusion die according to some embodiments. Pins 400a-c can be pins 110 of extrusion die 100. Pins 400a-c define slots 401 between adjacent pins through which ceramic-forming material is extruded during use. Pins 400a-c each comprise a base 402 and one or more coating layers 407 formed by a coating material 404, for example inorganic particles 320 described above, applied on or over side walls 406 of base 402. Coating material 404 defines an exterior most side wall 408 for the pins 400a-c that are coated by the coating material 404, while the side wall 408 of uncoated portions of the pins 400a-c are defined by the base 402. Coating material 404 shown in FIG. 4 has a generally uniform coating thickness 405 on each side wall 406 and has no surface defects (e.g., nodule 410 shown in FIG. 5).

In some embodiments, as shown in FIG. 5, coating material 404 applied over side walls 406 of bases 402 has a generally uniform coating thickness 405, but includes one or more surface defects, for example nodule 410. It may be desired to remove nodules 410 in coating material 404 to ensure that parts (e.g., honeycomb bodies) made using the extrusion die (e.g., the die 100) have uniform geometries. As shown in FIG. 5, contrary to a uniform target slot width 440, a slot width 440' between pin 400b and the adjacent pin 400c is not uniform along the entire length of pin 400b because of nodule 410, and is therefore not equal to target slot width 440 between pin 400b and adjacent pin 400a.

As used herein, a "slot width" is the distance measured between the exterior most side surfaces (coated or uncoated) of two adjacent pins and perpendicular to at least one of the exterior most side surfaces at a location on the pins proximate to the discharge face of the die. In a honeycomb extrusion die, the slot width corresponds to the thickness of the walls or webs of the honeycomb extrudate produced by the honeycomb extrusion die.

Rather than shimming to remove nodule 410, nodule 410 can be removed from coating material 404 using a cutting tool, for example a slitting wheel. The cutting tool can be cutting tool 650 described herein. Nodule 410 can be removed by the cutting tool in one or more passes of the cutting tool through a slot 401 between adjacent pins. While FIG. 5 illustrates a single nodule 410, coating material 404 applied over the bases 402 have many more than one nodule 410.

Figure 6:
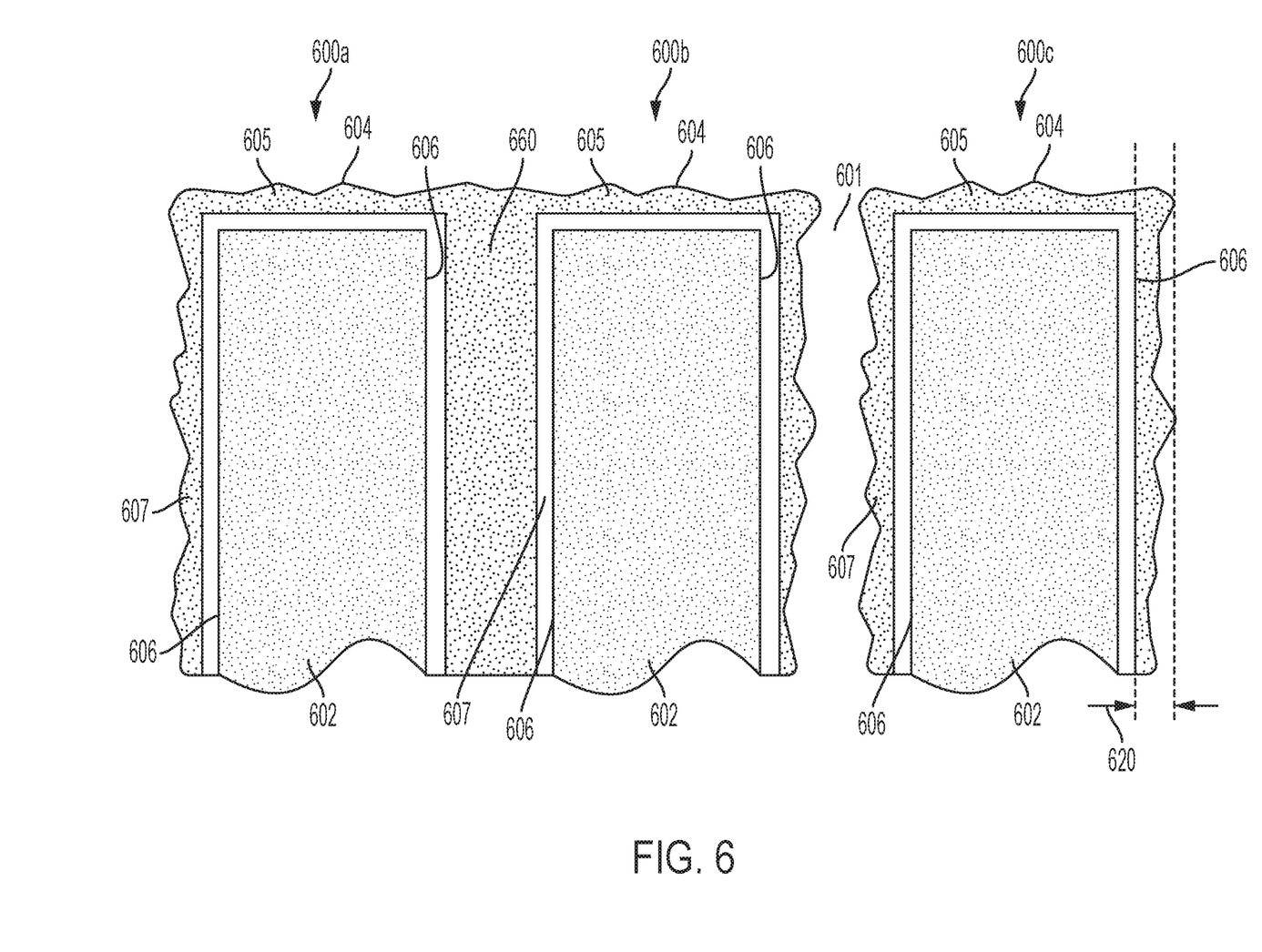
FIG. 6 illustrates overcoated pins of an extrusion die according to some embodiments.
Figure 7A:
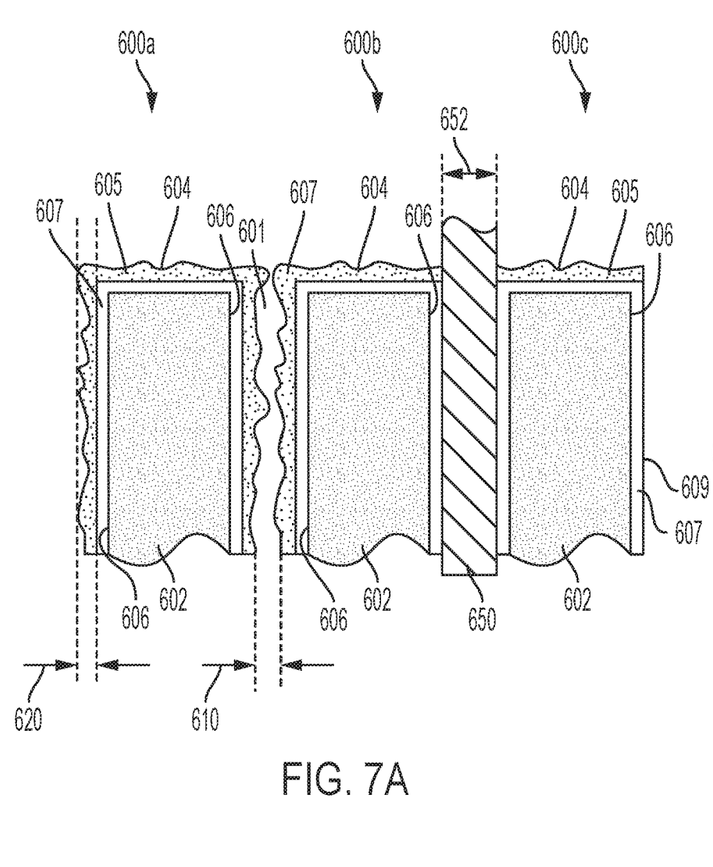
FIG. 7A illustrates the removal of a first portion of coating material from pins of the extrusion die of FIG. 6.
Figure 7B:
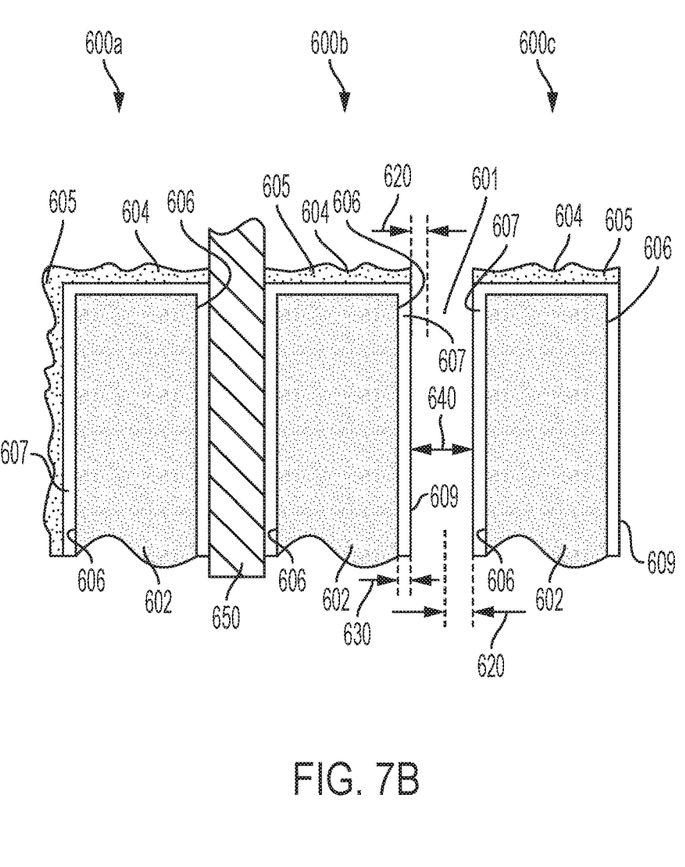
FIG. 7B illustrates the removal of a second portion of coating material from pins of the extrusion die of FIG. 6.

In some embodiments, as shown in FIGS. 6, 7A, and 7B, coating material 604 is applied over the side walls 606 of bases 602 of a plurality of pins 600a-c defining slots 601 therebetween. Pins 600a-c illustrated in FIGS. 6, 7A, and 7B can be or resemble the pins 110 of extrusion die 100. Similar to coating layers 407 on pins 400a-c of FIGS. 4-5, a coating layer 607 is formed on each of pins 600a-c by the coating material 604. In some embodiments, pins 600a-c comprise coating layer 607 as a single layer applied directly on side wall 606 of base 602, while in some embodiments, coating layer 607 is applied by depositing coating material 604 on or over one or more pre-existing coating layers (i.e., coating layer 607 is a single layer or multi-layer coating).

Each coating layer 607 in FIGS. 6-8B is illustrated in two different colors (relatively lighter and darker portions) to facilitate explanation of embodiments disclosed herein. More particularly, coating layers 607 are illustrated in FIGS. 6-6B with a lighter-colored inner portion and a relatively darker-colored outer portion. The lighter-colored inner portion indicates an example of a target final set of dimensions for the coating layers 607 (with respect to which the target slot width is achieved), while the darker-colored outer portion indicates an excess of material, which is referred to herein as an overcoat 605 for each of the pins 600a-c. It is to be appreciated that despite being illustrated using different colors, a single layer of coating material 604 can comprise at least some of both the darker- and lighter-colored portions, e.g., the entirety of each coating layer 607 can be formed by a single continuous layer of coating material 604.

As used herein, overcoating means applying a coating material to side walls of pins of an extrusion die so that the coating material has a thickness that is greater than a thickness needed to define a target slot width. According to embodiments disclosed herein, overcoating can be intentionally performed to assist in achieving target dimensions (e.g., a target slot width) after one or more further manufacturing steps.

Overcoats 605 are overcoated portions of coating layer(s) 607 of coating material 604 (i.e., that must be removed to achieve target slot widths 640). Overcoats 605 have an overcoat thickness 620 (which may also be referred to as an overcoated portion). Overcoats 605 of coating material 604 define a reduced slot width 610 between adjacent pins, for example, adjacent pins 600a and 600b, in comparison to target slot width 640. In some embodiments, overcoat 605 of coating material 604 occupies a significant percentage of the surface area of the coated feature of the extrusion die. For example, in some embodiments the coated area over one or more side walls 606 is equal to at least 20% of an area of side wall 606 (e.g., at least 20% of the side wall area 113 illustrated in FIG. 2). In other words, an overcoat 605 of coating material 604 can be disposed over an area of one or more side walls 606 equal to at least 20% of the side wall's surface area. That is, since a high degree of dimensional accuracy and a defect-free surface can be achieved by cutting processes, overcoating can be used to ensure that a significant portion of the area of a surface, e.g., greater than 20%, is dimensionally accurate and defect free. In this way, particularly advantageous in comparison to shimming in which very small defects must be precisely corrected on a defect-by-defect basis, overcoating a significant portion of a surface area enables all defects and/or dimensional variability in the overcoated area to be quickly and simultaneously corrected by the cutting process. More preferably, in some embodiments at least 50% of the area of a surface is overcoated. In some embodiments, the portions of the side walls of the pins immediately adjacent to the discharge face are overcoated. In some embodiments, the substantially all or even the entirety of one or more of the side walls 606 comprise the overcoat 605 (i.e., up to 100% of the surface area of the side wall(s) 606 is occupied by the overcoat 605). As discussed herein, overcoating the entirely of a surface can advantageously ensures that the entirety of that surface can be later machined to a target dimension.

Due to the excess thickness provided by the overcoats 605, reduced slot width 610 is smaller than a target slot width 640 (see e.g., FIG. 7B). In some embodiments, a cutting tool, for example, cutting tool 650 is used to remove overcoat(s) 605 of coating material 604 (i.e., the overcoated thickness 620 of coating material 604) to define the desired slot geometry (i.e., target slot width 640). For example, cutting tool 650 can remove thickness 620 of the overcoats 605 to define a target coating thickness 630 of the coating material 604 and a machined surface 609. In such embodiments, cutting tool 650 simultaneously eliminates any defects (e.g., nodules 410) on exterior surfaces of coating material 604, while setting uniform dimensions for the side walls 606 of the pins 600a-c. Advantageously, after removing the thickness 620 of the overcoat 605 of coating material 604, slot(s) 601 can be more accurately and consistently set to have a slot width equal to target slot width 640. It is noted that any excess material remaining on the surfaces of the pins at the discharge face of the extrusion die (e.g., the surfaces 114 and/or as shown on the pin 600c in FIG. 7B) after cutting the overcoat from the side walls can be removed in a separate cutting step, if desired.

In some embodiments, reduced slot width 610 is in the range of 0% to 99% of target slot width 640, including subranges. For example, in some embodiments, reduced slot width 610 is 0% of target slot width 640, 10% of target slot width 640, 20% of target slot width 640, 30% of target slot width 640, 40% of target slot width 640, 50% of target slot width 640, 60% of target slot width 640, 70% of target slot width 640, 80% of target slot width 640, 90% of target slot width 640, 95% of target slot width 640, or 99% of target slot width 640, or within a range having any two of these values as end points. In some embodiments, reduced slot width 610 is in the range of 50% to 99% of target slot width 640. In some embodiments, reduced slot width 610 is in the range of 80% to 95% of target slot width 640. These latter two ranges are preferred in some embodiments because they help ensure the corresponding surfaces are sufficiently overcoated while limiting the amount of excess material that must be removed to achieve the desired dimensions.

In some embodiments, coating material 604 can be applied to adjacent pins such that it completely fills a slot between two adjacent pins. For example, FIG. 6 shows a completely filled slot 660. For completely filled slot 660, reduced slot width 610 of the slot 601 is 0% of target slot width 640. Despite creating more waste material that must be removed to achieve the target slot width, completely filling a slot can be advantageous in some embodiments, particularly with respect to cutting tools or techniques that result in the cutting tool or pins vibrating or bouncing side-to-side as the cutting tool encounters relatively thicker or thinner portions of the overcoat. For example, the unevenness in the overcoat on opposite sides of the slot may bias a cutting tool in one direction or another as the cutting tool traverses the slot, which makes it more difficult to keep the cutting tool centered, and this biasing can be reduced when the slot is completely filled. In some embodiments, reduced slot width 610 is at least some minimum value less than the target slot width 640 to ensure that the thickness 620 is sufficiently wide to be accurately removed. For example, in some cutting or material removal techniques it can be relatively more difficult to remove only a very thin layer of material than it is to remove a relatively thicker portion. In some embodiments, the reduced slot width is at least 0.001 inches less than target slot width 640, such that the thickness 620 is at least 0.001 inches.

In some embodiments, target slot width 640 is in the range of about 0.001 inches to about 0.025 inches, including subranges. For example, in some embodiments, target slot width 640 is 0.001 inches, 0.002 inches, 0.0025 inches, 0.0027 inches, 0.003 inches, 0.005 inches, 0.0075 inches, 0.01 inches, 0.016 inches, or 0.025 inches, or within a range having any two of these values as end points. In some embodiments, target slot width 640 is in the range of about 0.002 inches to about 0.016 inches. In some embodiments, target slot width 640 is in the range of about 0.003 inches to about 0.016 inches.

Cutting tool 650 can be any cutting tool suitable for machining the coating materials described herein. In some embodiments, cutting tool 650 is an abrasive slitting wheel, for example an abrasive slitting wheel used in a CNC machine tool. Cutting tool 650 can be coated with an abrasive coating, for example a nickel, titanium, or copper-based coating. Cutting tool 650 can also comprise abrasive particles, for example diamond particles, cubic boron nitride particles, silicon carbide particles, aluminum oxide particles, or boron carbide particles. In some embodiments, the abrasive particles can have a size in the range of 1 to 50 microns (micrometers, µm), including subranges. For example, in some embodiments, the average size of the abrasive particles is 1 micron, 2 microns, 5 microns, 6 microns, 10 microns, 20 microns, 30 microns, 40 microns, 45 microns, or 50 microns, or within a range having any two of these values as end points.

In some embodiments, cutting tool 650 has a cutting width 652 equal to target slot width 640. Advantageously, this enables the final dimensions of the slots to be quickly and efficiently set, e.g., by a single pass of the cutting tool 650. In some embodiments, cutting tool has a blade with a blade width (which is cutting width 652) equal to target slot width 640. In such embodiments, thickness 620 of overcoat 605 of coating material 604 is removed from one or both pins 600 defining slot 601 with a single pass of cutting tool 650 though the slot 601. In some embodiments, thickness 620 of overcoat 605 is removed from within a slot 601 with two or more passes of cutting tool 650. In such embodiments, cutting tool 650 can have a cutting width 652 less than target slot width 640.

In some embodiments cutting tool 650 removes all or part of overcoat 605 from multiple pins in one pass through slots defined by adjacent rows of pins. For example, cutting tool 650 can pass between a first row of pins and a second row of pins, for example first row 111 and second row 119 of pins 110 shown in FIG. 2. In such embodiments, cutting tool 650 defines a target slot width between each of the adjacent pins within the two rows when passing through slots defined by the adjacent rows. In some embodiments, cutting tool 650 removes overcoat 605 between two adjacent rows of pins in a single pass thereby defining the target slot width 640 for the entire length of the slot by sequentially removing the thickness 620 from each pair of adjacent pins defining the slot in a single machining operation. By having the capability to remove overcoat 605 between two adjacent rows of pins in a single pass, the relevant portions of the overcoat 605 as well as any defects, for example, nodule(s) 410, can be removed quickly and efficiently. In this way, all of the pins within a die can be machined (and the target slot width achieved) within a few hours as opposed to a shimming process which may take one or more days to remove all of the defects within the coating material (e.g., nodules, dimensional variability, etc.).

In some embodiments, the depth of cut, (e.g., the portion of the overcoat 605 with respect to the thickness 620 and/or the y-direction for the surface 113 with respect to the coordinate system provided in FIG. 2) that is removed by cutting tool 650 has a thickness of at least 0.0005 inches. In some embodiments, the depth of cut, or the thickness of material removed by cutting tool 650 during a single pass of the cutting tool 650 through a slot is at least 0.0005 inches. In some embodiments, the depth of cut is equal to the thickness 620 (i.e., thickness 620 is removed in a single pass). In some embodiments, the depth of cut is less than the thickness 620. In some embodiments, the depth of cut has a thickness in the range of 0.0001 inches to the width of the cutting tool.

In some embodiments, target coating thickness 620 of coating material 604 after the overcoat 605 has been removed is within the range of 0.0006 inches to 0.006 inches, including subranges. For example, in some embodiments, the overcoated portion 620 that is removed has a thickness of 0.0006 inches, 0.001 inches, 0.002 inches, 0.003 inches, 0.004 inches, 0.005 inches, or 0.006 inches, or within a range having any two of these values as end points.

In some embodiments, cutting tool 650 is a blade capable for rotating at a peripheral velocity in the range of 2,500 to 20,000 surface feet per minute (SFPM), including subranges. For example, in some embodiments, the peripheral velocity is 2,500 SFPM, 5,000 SFPM, 10,000 SFPM, 15,000 SFPM, 17,000 SFPM, or 20,000 SFPM, or within a range having any two of these values as end points.

In some embodiments, the infeed velocity of the ceramic-forming material through the extrusion die after the extrusion die is manufactured according to the embodiments disclosed herein, is in the range of 0.1 to 30 inches per minute (IPM) including subranges. For example, in some embodiments, the infeed velocity is 0.1 IPM, 0.2 IPM, 0.5 IPM, 1 IPM, 1.4 IPM, 2 IPM, 3 IPM, 4 IPM, 5 IPM, 6 IPM, 7 IPM, 8 IPM, 9 IPM, 10 IPM, 15 IPM, 20 IPM, 25 IPM, or 30 IPM, or within a range having any two of these values as end points.

Figure 8A:
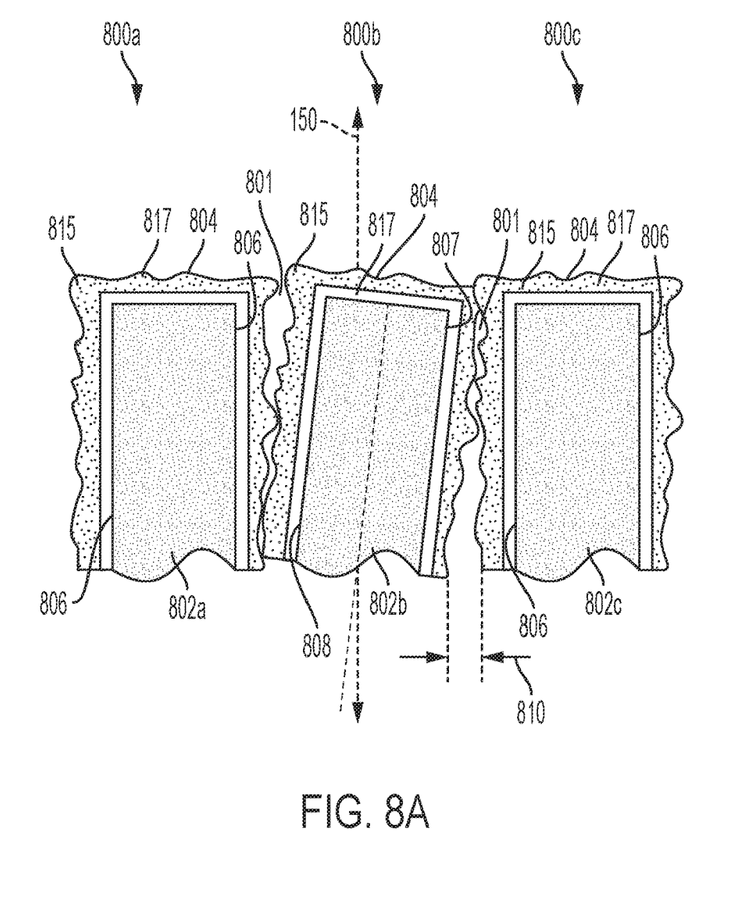
FIG. 8A illustrates overcoated misaligned pins of an extrusion die according to some embodiments.
Figure 8B:
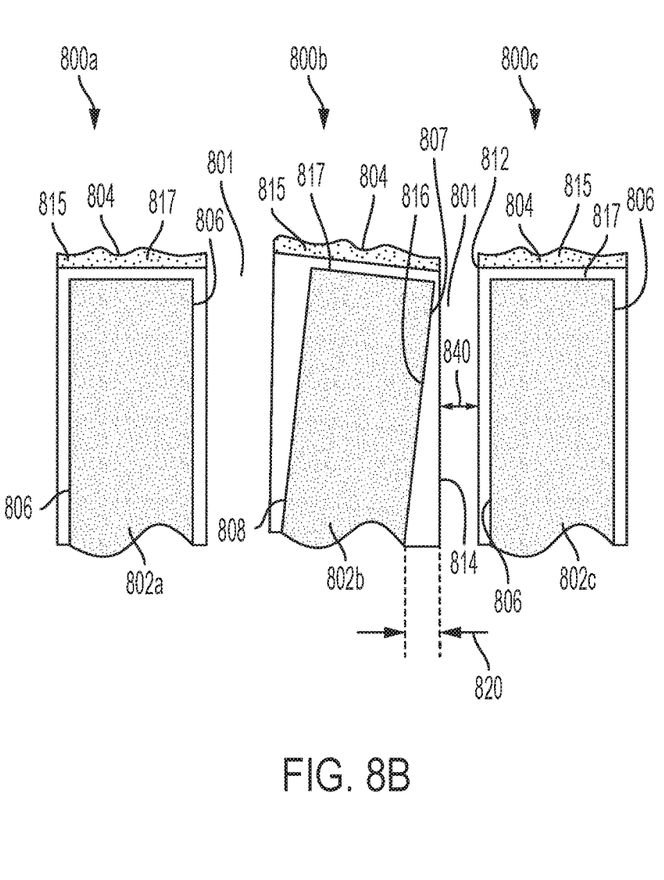
FIG. 8B illustrates the pins of the extrusion die of FIG. 8A after removing a portion of coating material.

Occasionally, pins within a honeycomb extrusion die become bent, warped, or otherwise distorted, which requires correction in order to ensure that the geometries of parts extruded through the die are uniform. For example, distortion to the pins of an extrusion die can result during use, e.g., due to high extrusion pressures, or during manufacturing, e.g., from temperature-induced stresses during high temperatures manufacturing processes such as chemical vapor deposition processes. Similar to shimming, inspecting and manually straightening each pin can be a very tedious, time consuming, and expensive process, which if done imprecisely may result in damage to the die. Rather than manually straightening each distorted pin, in some embodiments, for example as shown in FIGS. 8A and 8B, a bent pin base 802*b* can be coated with an overcoat of coating material 804. As discussed herein, the overcoat can be removed to accurately achieve one or more target dimensions and create an overall straight or otherwise desired geometry for the pin. In some embodiments, pins 800*a-c* comprise a coating layer 817 applied directly on side wall 806 of bases 802*a-c*. In some embodiments, pins 800*a-c* comprise an overcoat layer 815 applied on a pre-existing coating layer. Overcoats 815 are overcoated portions of coating layer(s) 817 of coating material 804 akin to the overcoats 605 discussed above.

For example, a plurality of pins 800*a-c* defining slots 801 can comprise at least one base 802*a* that is parallel with respect to a longitudinal axis of an extrusion die, for example longitudinal axis 150 of extrusion die 100. The longitudinal axis of an extrusion die (e.g., longitudinal axis 150) is the axis extending through the center of an extrusion die face and parallel to the direction in which material is extruded through the extrusion die. This axis may be referred to as the extrusion axis of the extrusion die.

Pins 800*a-c* can additionally comprise at least one base 802*b* that is non-parallel with respect to a longitudinal axis of the extrusion die. In such embodiments, coating material 804 is applied to bases 802*a* and 802*b* defining a reduced slot width 810 between two adjacent pins, for example pins 800*b* and 800*c* and/or pins 800*a* and 800*b*. In some embodiments, an overcoat of coating material is applied to the adjacent pin bases. To achieve a target slot width 840 of slots 801 that corrects for non-parallel base 802*b*, a cutting tool, for example cutting tool 650 described above, can be used to remove a portion of the coating material 804 to define a target slot width 840 for each adjacent pair of pins 800*a-c* having exterior surfaces 812 parallel to the longitudinal axis of an extrusion die.

With respect to the dimensional ranges given for extrusions dies having slot widths herein (e.g., an extrusion die having a slot width in the range of 0.001 inches to about 0.025 inches), a "parallel surface or side wall" means a surface or side wall that extends in a direction parallel to a longitudinal axis (e.g., longitudinal axis 150) or that is angled at no more than +/−0.25 to 2.0 degrees relative to the longitudinal axis. Correspondingly, a "non-parallel surface or side wall", with respect to the dimensional ranges given herein, is a surface or side wall that is angled more than +/−0.25 to 2 degrees relative to a longitudinal axis. It is to be appreciated that narrower slot widths are generally limited to the smaller range of angles (e.g., closer to 0.25 degrees), particularly for pins having longer longitudinal lengths. Similarly, wider slot widths may permit a larger degree of misalignment (e.g., closer to 2 degrees), particularly for pins having relatively shorter longitudinal lengths.

In FIGS. 8A-8B, pins 800*a-c* comprise coating material 804 disposed over a side wall 806 of a first base 802*a* and coating material 804 disposed over a first side wall 807 and a second side wall 808 of a second pin base 802*b*. As shown in FIGS. 8A-8B, an extrusion die can comprise a combination of relatively parallel and non-parallel pins. More particularly, pins 800*a* and 800*c* are illustrated as being parallel, while pin 800*b* is illustrated as being non-parallel (the axis for the pin 800*b* is illustrated in FIG. 8A, which is parallel to the side walls 808 of the pin 800*b*, and non-parallel with respect to the longitudinal axis 150). For example, coating material 804 disposed over side wall 806 has a machined exterior surface 812 (that is, after removal of the overcoat 815) parallel to the longitudinal axis (e.g., longitudinal axis 150) of an extrusion die. Coating material 804 disposed over side wall 808 has a machined exterior surface 814 parallel to the longitudinal axis of the extrusion die and an interior surface 816 disposed over side wall 808, but is not parallel with respect to the longitudinal axis. Accordingly, the thickness 820 of coating material 804 disposed over side wall 808 varies along the length of pin 800*b* to enable the outer surface to be parallel with respect to the rest of the pins 800 and the longitudinal axis 150, thereby correcting for bent or angled (i.e., non-parallel) pin 800*b*, without requiring the base 802*b* of the pin to be straightened. While FIG. 8A illustrates pins 800 that comprise a single non-parallel pin 800*b*, more than one pin of an extrusion die can be non-parallel, and a target slot width between any two pins (one non-parallel or both non-parallel) can be corrected as illustrated in FIGS. 8A-8B.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. An extrusion die, comprising:
   a plurality of pins defining a plurality of slots arranged in a honeycomb geometry, the plurality of pins comprising a first pin comprising a first base with a parallel side wall face with respect to a longitudinal axis of the extrusion die and a second pin, adjacent to the first pin, comprising a second base with a non-parallel side wall face with respect to the longitudinal axis of the extrusion die;
   a first coating layer disposed over the parallel side wall face of the first pin wherein an interior surface of the first coating layer is parallel to the longitudinal axis;
   a second coating layer disposed over the non-parallel side wall face of the second pin; and
   an overcoat layer disposed over the second coating layer wherein an exterior surface of the overcoat layer is parallel to the longitudinal axis, and an interior surface of the second coating layer, opposite the exterior surface of the overcoat layer, is not parallel to the longitudinal axis.

2. The extrusion die of claim 1, wherein the non-parallel side wall is angled more than 0.25 degrees relative to the longitudinal axis of the extrusion die.

3. The extrusion die of claim 1, wherein the non-parallel side wall is angled more than 2 degrees relative to the longitudinal axis of the extrusion die.

4. The extrusion die of claim 1, wherein the first coating layer has a thickness which varies along the length of at least one of the pins having the non-parallel side wall.

5. The extrusion die of claim 1, wherein the extrusion die is a honeycomb extrusion die.

* * * * *